United States Patent
Dobbs et al.

(10) Patent No.: US 6,856,518 B2
(45) Date of Patent: Feb. 15, 2005

(54) ASSEMBLY FOR SUPPORTING A SHORT PRINTED CIRCUIT CARD

(75) Inventors: Robert William Dobbs, Granite Bay, CA (US); Andrew Harvey Barr, Roseville, CA (US); Stephan Karl Barsun, Davis, CA (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/619,026

(22) Filed: Jul. 14, 2003

(65) Prior Publication Data

US 2005/0013125 A1 Jan. 20, 2005

(51) Int. Cl.⁷ .............................. H05K 7/14; H05K 7/18
(52) U.S. Cl. ....................... 361/801; 361/684; 361/685; 361/740; 361/736
(58) Field of Search ................................ 361/801, 725, 361/753, 740, 736, 726, 684, 685, 788

(56) References Cited

U.S. PATENT DOCUMENTS

| | | | |
|---|---|---|---|
| 5,883,792 A | 3/1999 | Summers et al. | |
| 6,125,044 A | 9/2000 | Cherniski et al. | |
| 6,169,662 B1 | 1/2001 | Clark et al. | |
| 6,201,711 B1 | 3/2001 | Cherniski et al. | |
| 6,320,760 B1 | 11/2001 | Flamm et al. | |
| 6,414,851 B2 | 7/2002 | Cherniski et al. | |
| 6,606,255 B2 * | 8/2003 | Barringer et al. | ........... 361/807 |

* cited by examiner

Primary Examiner—Kamand Cuneo
Assistant Examiner—Hung S. Bui (57) ABSTRACT

An assembly for supporting a short printed circuit card includes a card slot separator disposed in a card bay of a computer system and at least one card support block. The at least one card support block couples to the card slot separator and can be selectively positioned along the card slot separator for reception of an unsupported edge of the short printed circuit card.

26 Claims, 8 Drawing Sheets

ASSEMBLY FOR SUPPORTING A SHORT PRINTED CIRCUIT CARD

BACKGROUND

Expansion cards are inserted into a card bay in an electronic system, such as a computer system, to enable one or more microprocessors to be connected to external devices. Generally, expansion cards permit expanded performance from a computer system through connection with external devices. A peripheral component interconnect (PCI) system is one example of a system configured to expand the utility of a computer system through connection with external devices. A PCI system includes PCI slots that are externally accessible for reception of PCI cards. PCI cards are inserted into a card bay of the PCI system. Compatible external devices can be plugged into the PCI cards, which are one type of expansion card. Expansion cards that do not span the full length of the card bay that they are inserted into are known as short cards.

A computer system typically comprises a chassis for structural support, a central processing unit (CPU), various cooling fans, a card bay to house removable printed circuit assemblies (PCA), and an array of other electrical components. The card bay is designed to receive removable printed circuit cards, such as input/output (I/O) cards. The card bay provides card guides on one side that are aligned to coordinate with the bulkhead guides on the opposing, or bullhead, side. In practice, an expansion card would typically be inserted into the computer system card bay by coupling one edge of the expansion card to the bulkhead guide and coupling the opposing edge of the expansion card to the complementary card guide on the other side of the card bay. The expansion card is then mechanically and electrically coupled to the computer at the backplane, or mid-plane, or generally, at the connector plane. Therefore, a card that spans the full length of the card bay is typically supported on three edges.

Expansion cards are uniquely configured to support specific applications, and hence, not all expansion cards are the same size. Indeed, some expansion cards do not span the full length of the card bay of the computer system. Such expansion cards, known as short cards, are supported only on two edges; the one edge mechanically coupled by the bulkhead guide and the second edge mechanically and electrically coupled to the connector plane. Therefore, short cards installed in a computer system have at least one unsupported edge and are susceptible to bending and damage when subjected to harsh forces.

A computer system suitable for service in a harsh environment, especially a computer system employed in telecommunications, is typically qualified for operation in the harsh environment. Harsh environments can be encountered in deploying mobile computers, such as computers mounted on delivery trucks, machine shop applications where the computers are subjected to vibrations, computer systems located in earthquake zones, and any situation that would subject the computer system to bumps, drops or large amplitude vibrations. The military and government agencies deploy a wide variety of computers and telecommunication equipment in diverse environments, and the military and government agencies encourage suppliers to employ both widely available components and cards, as well as the best value components and cards. Consequently, short cards are often installed in computer and telecommunication systems that are subjected to harsh environments. In addition, implementation of these computer and telecommunication systems is subject to qualification with certain performance specifications.

Performance specifications for a variety of measurable system parameters can be specified by the military or government agencies, or by industry groups. For example, all electronic equipment has the potential to interfere with other electronic equipment. Interference can be caused by electromagnetic radiation, the grounding system, the electrical power connection, excessive heat or insufficient airflow, and connecting wires or cables. The Federal Communications Commission (FCC) regulates a portion of this through Part 15 of their rules and regulations. FCC Part 15 specifies a maximum allowable amount of electromagnetic radiation from an electronic device in a commercial or residential environment at specific frequencies.

Network Equipment Building System (NEBS) is an industry standard that addresses the issue of collocated electronic equipment. Telephone companies typically place a large amount of network equipment, often from different manufacturers, into relatively tight association especially in their central office buildings. To account for this, they gathered input from the FCC and various national and international trade and standards groups to create a set of specifications for network facilities-located equipment. Originally developed by Bell Telephone laboratories in the 1970s and expanded by Bellcore, this standard is known as NEBS, or NEBS criteria.

The rigorous NEBS criteria have become a universal measure of network product excellence. NEBS compliance is required for equipment deployed in the central office in the North American Public Switched Network. NEBS compliance is an advantage for access providers including Local Exchange Carriers (LECs), Competitive Access Providers (CAPs), Competitive Local Exchange Carriers (CLECs), Internet Service Providers (ISPs), and Access Service Providers (ASPs). Products that are NEBS compliant are also expected to be top performers in network environments. The NEBS criteria are the most referenced documents in the United States Telecomnmunications Industry on the subject, and are designed to help ensure that telecom equipment is easy to install, operates reliably, and efficiently occupies building space. The expectation is that specifications for equipment configuration and compatibility will simplify product installation and reduce maintenance costs.

Regional operating companies and inter-exchange carriers insist upon NEBS compliance. NEBS is a baseline for vendor selection and deployment by service providers such as CLECs, ISPs, and independent telephone companies and others.

Even more stringent than the FCC Part 15 requirements, NEBS addresses a wide range of parameters related to personal safety, protection of property, and operational continuity. The NEBS criteria specifies parameters for space planning, temperature, humidity, fire, earthquake, vibration, transportation acoustics, air quality, and illumination as well as electrostatic discharge (ESD), electromagnetic interference (EMI), lightning and AC power fault, steady state power induction, corrosion direct current potential difference, and electrical safety in configuring telecommunication devices.

With the above in mind, one approach that the computer system industry has taken is to select and insert a best value short card and leave it unsupported on one edge. This method allows a wide variety of cards to be installed in the computer systems and enables the manufacturers to select the best value components. However, when the short cards are unsupported on one edge, the computer system is unlikely to meet the NEBS criteria for use in harsh environments, and so, the lack of robustness limits the utility of the computer system in the marketplace.

Another approach taken by the computer system industry is to select only full-length cards that will be supported on three edges by the bulkhead guides, card guides, and the connector plane. This approach ensures that the full-length cards are adequately supported, but limits the selection and value of the cards that may be installed in the computer system. Therefore, the computer system may meet the NEBS criteria, but may not offer the consumer the breadth of applications they require and may not offer sufficient value.

For the reasons stated above and for other reasons presented in this disclosure, a need exists for computer systems qualified for use in harsh environments that employ varying length printed circuit cards including short cards.

SUMMARY

One aspect of the present invention provides an assembly for supporting a short printed circuit card. The short printed circuit card has a first edge and is insertable into a computer system. The assembly for supporting a short printed circuit card includes a card slot separator disposed in a plane parallel to the short printed circuit card and at least one card support block having a card receptor adapted to couple with the first edge of the short printed circuit card. The card support block is adapted to couple to the card slot separator, and can be selectively positioned for reception of the first edge of the short printed circuit card in a plurality of positions along the card slot separator.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
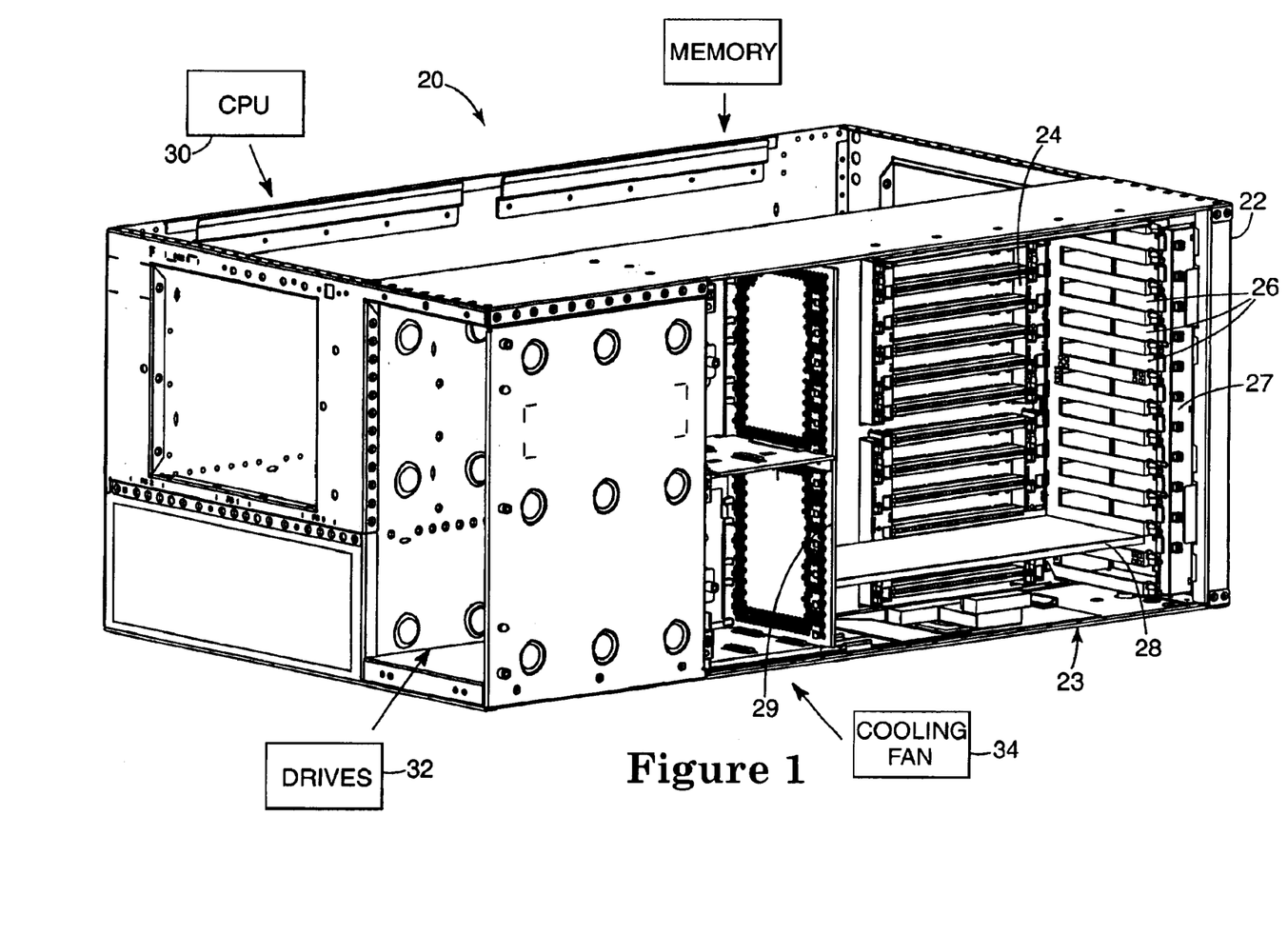
FIG. 1 is perspective view of one embodiment of a computer system including card guides, a connector plane, and a card slot separator.

One embodiment of a computer system is generally illustrated at 20 in FIG. 1. The following detailed description describes various embodiments of the present invention implemented in computer systems, but the present invention can be implemented in other types of electronic systems. Computer system 20 includes a chassis 22, a card bay 23, a connector plane 24, bulkhead guides 26 located on a bulkhead side 27, and a card slot separator 28. Card slot separator 28 spans the width of card bay 23 from bulkhead side 27 to card guide side 29. Other embodiments of computer system 20 include multiple card slot separators 28 positioned parallel to one another. In the illustrated embodiment, connector plane 24 is a backplane. Other embodiments of a computer system include a mid-plane connector plane. Computer system 20 further includes a central processing unit (CPU) 30, drives 32, cooling fan 34, and various other components associated with computer systems.

Figure 2:
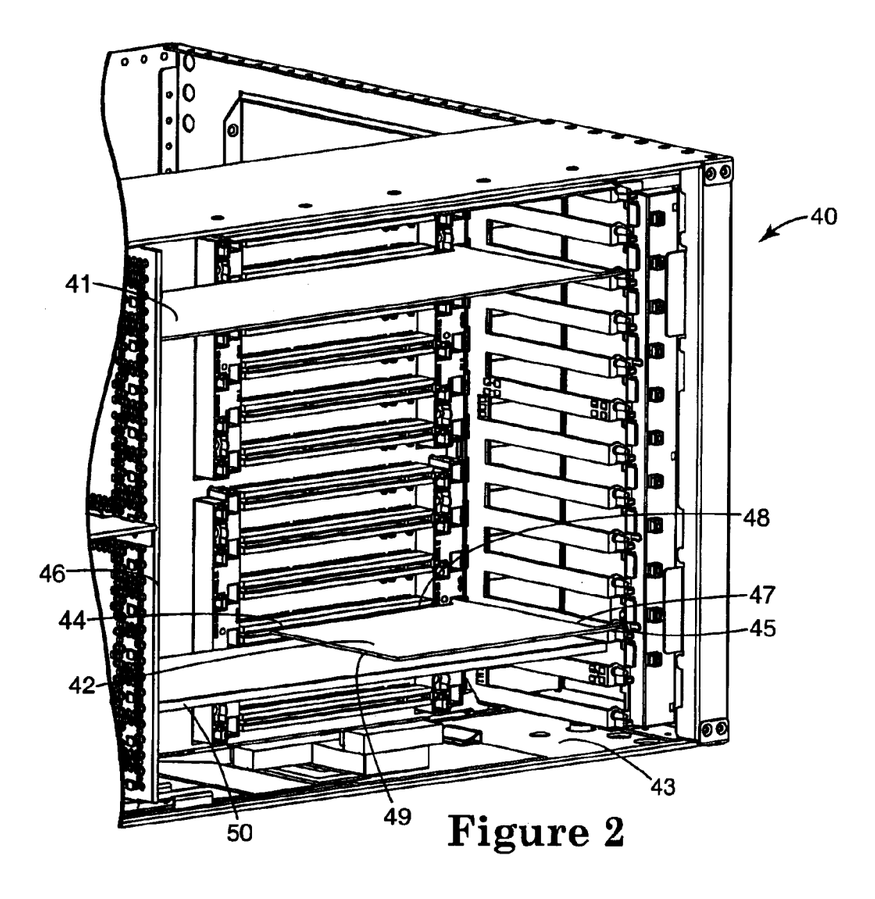
FIG. 2 is a perspective view of the computer system of FIG. 1 with printed circuit cards inserted.

A computer system with printed circuit cards inserted is generally illustrated at 40 in FIG. 2. Computer system 40 includes a full-length printed circuit card 41 and a short printed circuit card (short card) 42 inserted into card bay 43. Full-length printed circuit card 41 mechanically and electrically couples to connector plane 44, and mechanically couples to both bulkhead guides 45 and card guide side 46. In contrast, short card 42 electrically couples to connector plane 44 but is mechanically coupled only to bulkhead guides 46. Therefore, short cards 42 do not span the full length of card bay 43 from bulkhead guides 45 across to card guide side 46. Accordingly, short cards 42 are distinguished from fill-length printed circuit cards in that short cards 42 do not couple to card guide side 46. In particular, short card 42 is inserted into card bay 43 and includes a bulkhead edge 47 coupled to bulkhead guides 45, a connector edge 48 that is coupled mechanically and electrically to the connector plane 44, and an interior edge 49 that is unsupported. Due to interior edge 49, short cards 42 are susceptible to deflection when subjected to dropping, strong vibrations, or bumps.

Additionally, computer system 40 includes card slot separators 50 as illustrated in FIG. 2. Card slot separators 50 (one shown) are provided to prevent printed circuit cards 41 and short cards 42 from touching other printed circuit cards or other circuitry. Card slot separators 50 are mechanically coupled to the computer system chassis but are not electrically coupled. Card slot separators 50 are provided primarily to prevent printed circuit cards 41 and 42 from touching each other as computer system 40 is serviced or jostled during operation. For example, under shock and vibration conditions, such as environmental testing forklift drops, earthquakes, or mobile use of computers, interior edge 49 of short card 42 can slap adjacent cards 41 and 42 or card slot separators 50 and/or portions of card bay 43. Such slapping can cause both damage to printed circuit cards 41 and 42 and damage to various other computer components. Catastrophic damage to computer system 40 can occur if electrically coupled cards 41 and 42 touch for these reasons, card slot separators 50 are provided to prevent cards 41 and 42 from touching during service or operation of computer system 40.

Card slot separators 50 form a physical barrier between expansion cards (i.e., printed circuit cards 41 and 42) to mitigate card touching, either during routine servicing or during actual operation of computer system 40. Card slot separators 50 decrease the likelihood that electrically coupled expansion cards 41 and 42 will touch if deflection occurs, which-could lead to catastrophic failure of computer system 40. However, card slot separators 50 are not intended to decrease the deflection of short cards 42 that are installed into the card bay 43. Accordingly, even in a computer system 40 furnished with card slot separators 50, deflection of expansion cards 41 and 42, and in particular short cards 42, can lead to damage and the potential failure of computer system 40.

Figure 3:
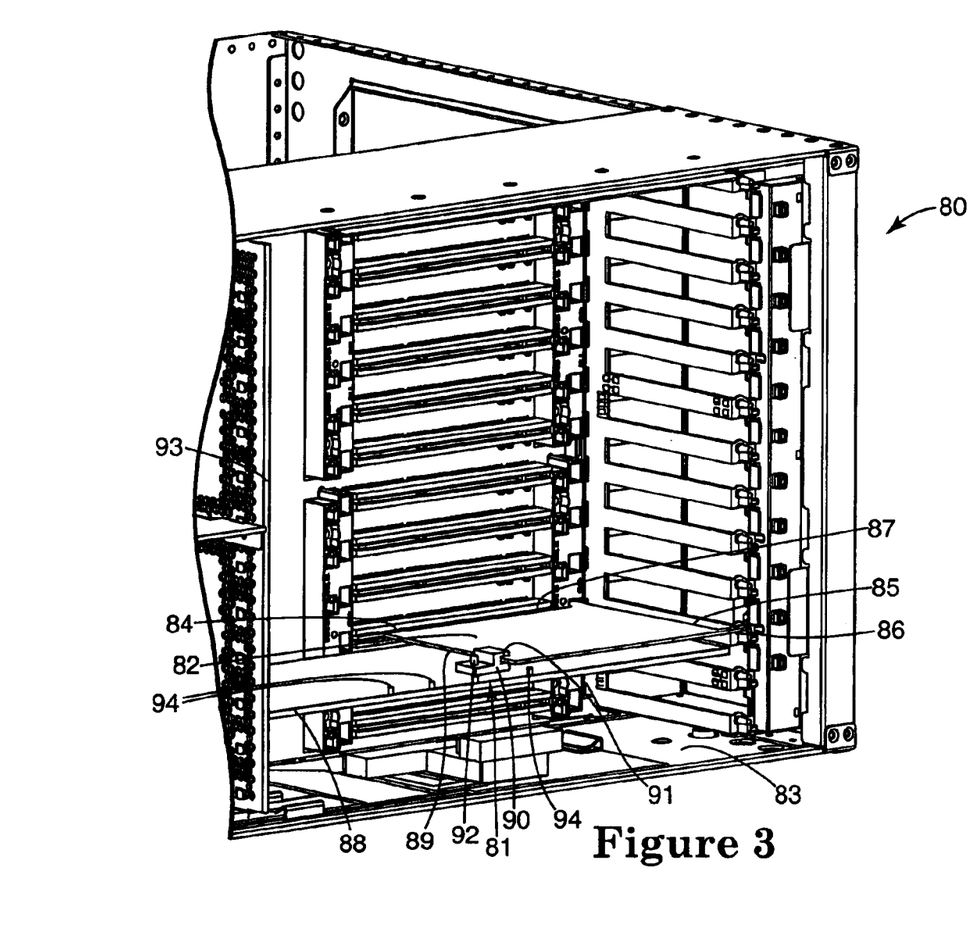
FIG. 3 is a perspective view of a computer system including an assembly for supporting a short printed circuit card according to one embodiment of the present invention.

An assembly 81 for supporting a short card 82 inserted in a computer system 80 according to one embodiment of the present invention is illustrated in FIG. 3. Short card 82 is shown inserted in card bay 83. In particular, short card 82 is mechanically coupled on a bulkhead edge 85 by bulkhead guide 86 and is mechanically and electrically coupled on a connector edge 87 to connector plane 84. A card slot separator 88 is provided in a parallel orientation to short card 82. An interior edge 89 of short card 82 is located proximate card slot separator 88 and is vulnerable to deflection if subjected to a jarring motion. However, as illustrated, short card 82 is supported at interior edge 89 by card support block 90. Specifically, interior edge 89 of short card 82 is coupled to and supported by a card receptor 91 associated with card support block 90. Card support block 90 is coupled to card slot separator 88 via a coupling device 92.

Card slot separator 88 spans the full-length of card bay 83 from bulkhead guides 86 across card bay 83 to an opposing card guide 93 and the full width of card bay 83 from connector plane 84 to card bay 83 opening. Coupling device 92, in conjunction with coupling detents 94 defined by card slot separator 88, allows card support block 90 to be selectively positioned along card slot separator 88. Accordingly, as illustrated in FIG. 3 card support block 90 includes card receptor 91 adapted to couple with interior edge 89 of short card 82. Card support block 90 is adapted to be selectively positioned along card slot separator 88 for reception of interior edge 89 of short card 82.

Figure 4:
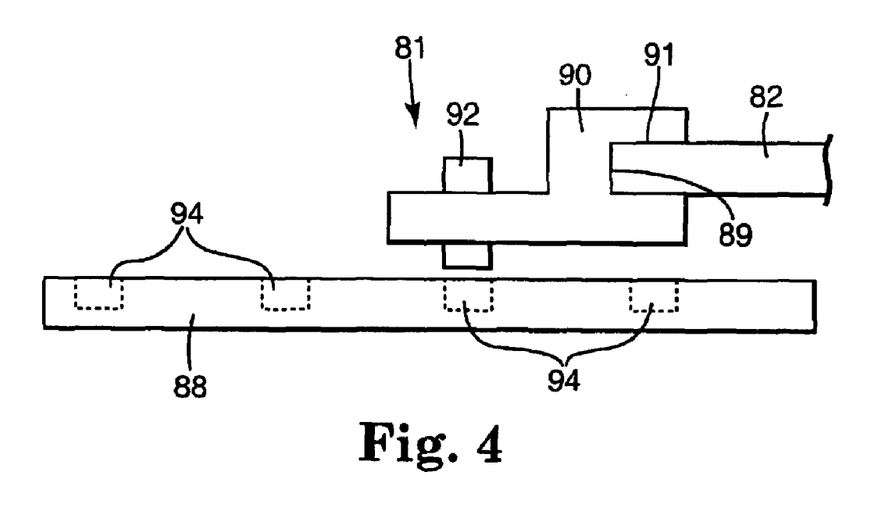
FIG. 4 is an illustration of the assembly of FIG. 3.

FIG. 4 is a perspective view of the assembly 81 for supporting short card 82 shown in FIG. 3. In general, short card 82 is disposed in a plane parallel to card slot separator 88, and short card 82 includes interior edge 89. Card support block 90 is provided and includes card receptor 91 adapted to couple with interior edge 89. Coupling device 92 is associated with card support block 90 and enables card support block 90 to be coupled to card slot separator 88. In this regard, card slot separator 88 is modified to include coupling detents 94 that interact with coupling device 92 such that card support block 90 is adapted to be selectively positioned along card slot separator 88. In this manner, card support block 90, and in particular, card receptor 91, is adapted to be selectively positioned for reception of interior edge 89 of short card 82 in a plurality of positions along card slot separator 88. In one embodiment, card support block 90 is capable of supporting short cards 82 of varying lengths. In one embodiment, card support block 90 can be selectively positioned to support interior edge 89 of short card 82 such that short card 82 (and the electronic computer system it is installed in) meets the NEBS criteria (discussed in the Background section of the present application).

In one embodiment, card receptor 91 is configured to accommodate a multiplicity of shapes of interior edges 89. In particular, card receptor 91 is adaptable to a variety of short cards 42. Consequently, card receptor 91 is sized to accommodate interior edges 89 having varying thickness. One suitable geometry for card receptors 91 is a wedge-shape, or <shape (i.e., an alligator shape as viewed in cross section). In one embodiment, interior edges 89 of short cards 42 frictionally engage with, and are supported by, the wedge-shape of card receptors 91. In another embodiment, card receptor 91 comprises a "C" shape selected to couple with and secure interior edge 91 of short card 42. In an alternative embodiment, card receptors 91 are configured to be adjustable, for example height adjustable, such that card receptors 91 expands or contracts to accept short cards 42 having varying thickness.

In one embodiment, card support block 90 is selectively positioned along card slot separator 88 among a discrete number of positions. In another embodiment, card support block 90 is selectively positioned along card slot separator 88 through a continuous selection of positions. In any regard, card support blocks 90 are adapted to couple with short cards 82 of varying thickness and varying lengths. Accordingly, in one embodiment, card support block 90 couples to a portion of interior edge 89 (as shown in FIG. 3). In another embodiment, card support block 90 couples to short card 82 for substantially the full width along interior edge 89 of short card 82. Other suitable orientations of card support blocks 90 that serve to support short cards 82 can be employed.

Figure 5:
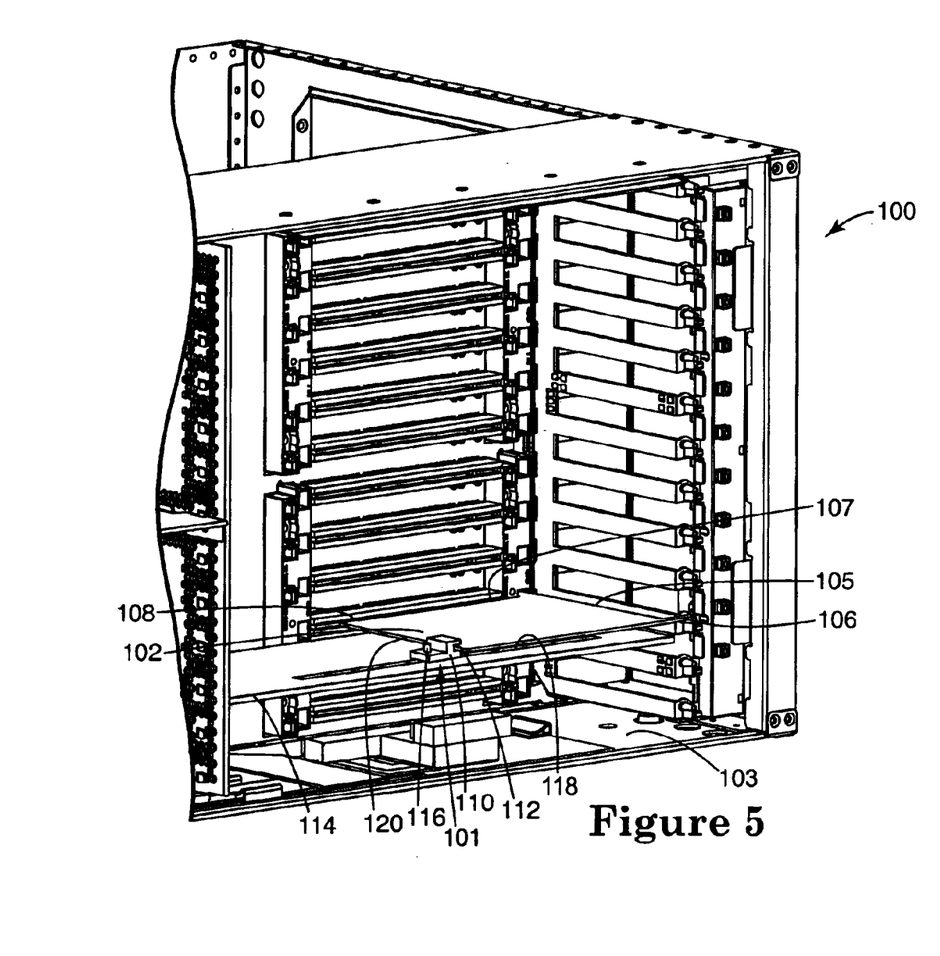
FIG. 5 is a perspective view of another embodiment according to the present invention of a computer system including an assembly for supporting a short printed circuit card.

Another embodiment of a computer system with an assembly 101 for supporting a short card 102 is illustrated generally at 100 in FIG. 5. Short card 102 is inserted in card bay 103. In particular, short card 102 is mechanically coupled on bulkhead edge 105 to bulkhead guide 106 and is mechanically and electrically coupled on connector edge 107 to connector plane 108. A card support block 110 including a card receptor 112 is coupled to a card slot separator 114 via a coupling device 1116. In one embodiment, card slot separator 114 defines a coupling channel 118 such that card support block 110 can be selectively positioned for reception of short card 102. In this regard, card receptor 112 is configured to receive an interior edge 120 of short card 102. Since short cards 102 can have varying lengths, selectively positioning card support block 110 along card slot separator 114 enables the accommodation of a variety of lengths of short cards 102. Coupling device 116 can be manipulated to secure card support block 110 at the desired location on card slot separator 114. In one embodiment, coupling channel 116 allows card support block 110 to be positioned anywhere along the length of card slot separator 114. In one embodiment, coupling channel 116 is a slot (e.g., a channel or a continuous opening) that functions in a complimentary manner with coupling device 116 to permit secure and selective positioning of card support block 110 for reception of short cards 102 of any length.

FIG. 5 illustrates one embodiment of assembly 101 for supporting short card 102 in computer system 100 where coupling channel 118 is configured to selectively position card support block 110. Coupling channel 118 could be located centrally with respect to card slot separator 114, or alternately, coupling channel 118 could be located offset with respect to a width of card slot separator 114.

Figure 6:
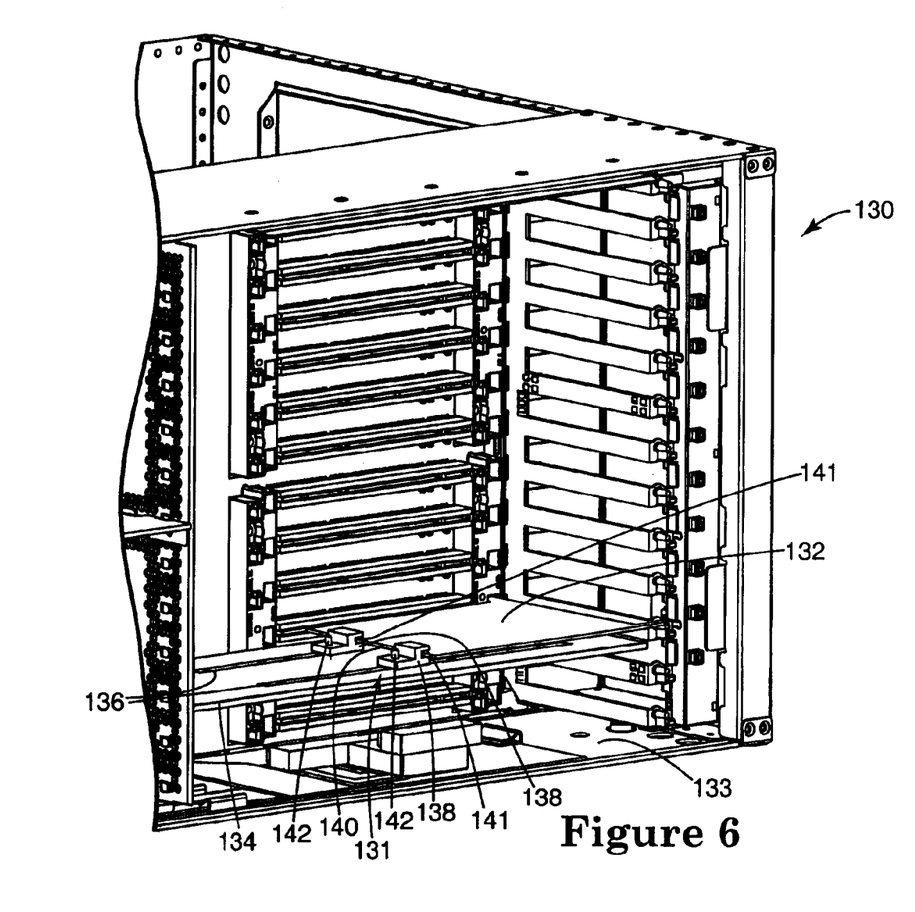
FIG. 6 is a perspective view of yet another embodiment according to the present invention of a computer system including assemblies for supporting a short printed circuit card.

FIG. 6 illustrates one embodiment of an assembly 131 for supporting a short card 132 in a computer system 130.

Computer system 130 includes short card 132 inserted in a card bay 133 in a manner similar to that depicted in FIG. 5. A card slot separator 134 is substantially parallel to a plane of short card 132. Card slot separator 134 includes two coupling channels 136. As illustrated, each coupling channel 136 has associated with it a card support block 138 adapted to couple with an interior edge 140 of short card 132. In particular, each card support block 138 includes a card receptor 141 adapted to couple with interior edge 140. Additionally, each card support block 138 includes a coupling device 142 configured to securely position card support block 138 along a respective coupling channel 136. In one embodiment, coupling channels 136 allow card support blocks 138 to be positioned independently anywhere along the length of card slot separator 134. In one embodiment, coupling channels 136 include a slot (e.g., a channel or a continuous opening) that functions in a complimentary manner with coupling devices 142 to permit secure and selective positioning of card support blocks 138 for reception of short cards 132 of any length. In one embodiment, a single card support block 138 is provided and is configured to couple with two coupling channels 136. In this case, single card support block 138 includes one card receptor 141 adapted to couple with interior edge 140 of short card 132. In another embodiment, card support block(s) 138 couple to short card 132 for substantially the full width of interior edge 140.

Figure 7:
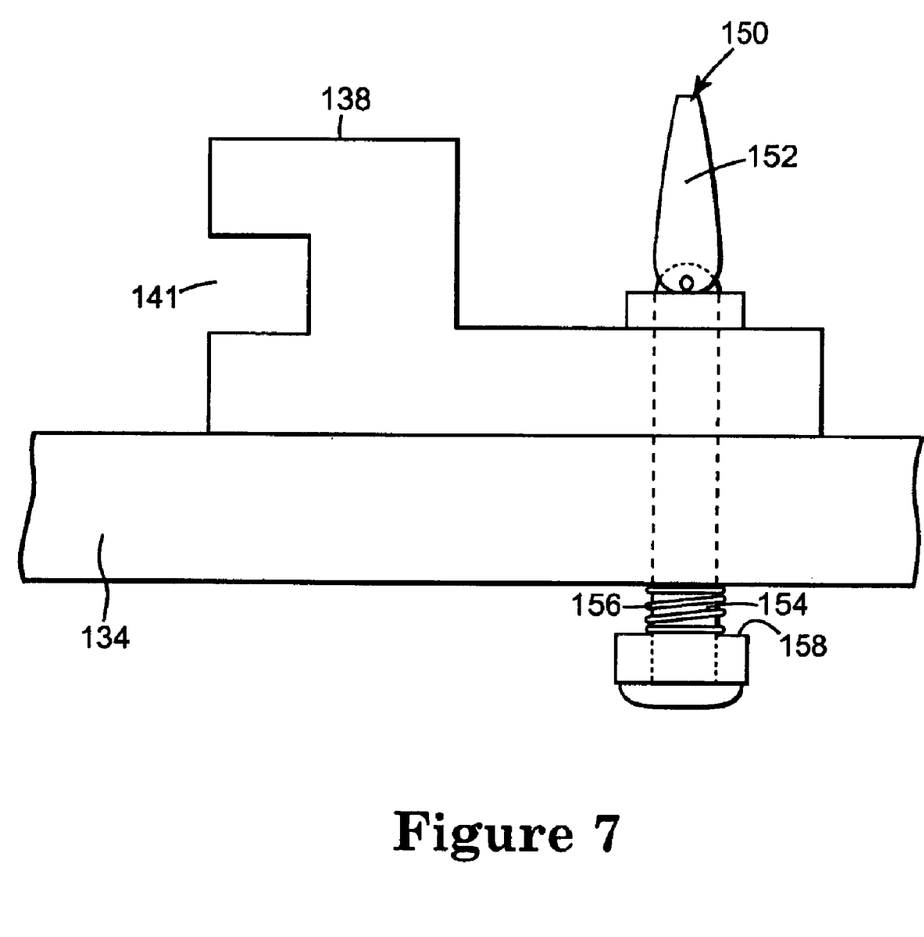
FIG. 7 is a side view of an assembly for supporting a short printed circuit card according to one embodiment of the present invention.

Card support blocks 138 can comprise a variety of forms. By way of example, FIG. 7 is an expanded view of one card support block 138 illustrated in FIG. 6. Card support block 138 is shown coupled to card slot separator 134. Card support block 138 defines a card receptor 141 adapted to couple with short cards (not shown). A coupling device 150 is provided to selectively positioned card support block 138 at a desired location along card slot separator 134. In one embodiment, coupling device 150 includes a lever 152 coupled to a bolt 154 and a tension spring 156. As illustrated in FIG. 7, coupling device 150 is in a loosened state configured for movement along card slot separator 134, for example, along a coupling channel (not shown). To fix card support block 138 at a desired location along card slot separator 134, lever 152 is rotated 90 degrees such that tension spring 156 is activated. Thus, upon rotation of lever 152, bolt 154 is drawn towards card slot separator 134 until bolt face 158 is seated and secured against card slot separator 134. Consequently, card support block 138 is selectively positioned along card slot separator 134.

As illustrated in FIG. 6, card slot separator 134 is positioned parallel to an orientation of short card 132. Accordingly, card slot separator 134 forms a separation plane between adjacently stacked cards 132. In one embodiment, a distance between any short card 132 and an adjacent card slot separator 134 is a constant distance. Therefore, card receptor 141 can be located on card support block 138 at a position corresponding to a constant distance above card slot separator 134 for acceptance of short cards 132. In another embodiment, a distance between short card 132 and an adjacent card slot separator 134 is a variable distance. For example, in the case here short cards 132 and card slot separator 134 do not alternate positions, it can be desirable to have a card support block 160 configured with a variably positioned card receptor, as illustrated in FIG. 8.

Figure 8:
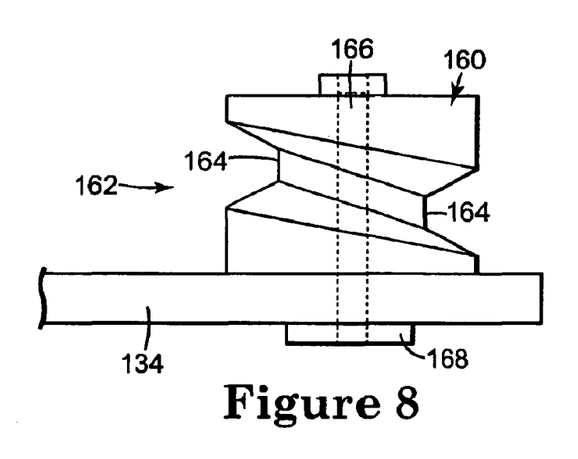
FIG. 8 is a side view of an assembly for supporting a short printed circuit card according to another embodiment of the present invention.

FIG. 8 illustrates card support block 160 that defines a spiral receptor groove 162. Spiral receptor groove 162 provides a continuously variable vertical position for a card receptor 164 that is adapted for reception of interior edge 140 of short card 132 (FIG. 6). Card support block 160 can be rotated about a central axis defined by a bolt 166 in selecting a vertical position of card receptor 164. In one embodiment, a nut 168 is provided that secures bolt 166 in coupling card support block 160 at a desired position along card slot separator 134. In one embodiment, spiral receptor groove 162 is adaptable to a variety of short cards 132. Consequently, spiral receptor groove 162 is sized to accommodate interior edges 140 having varying thickness. One suitable geometry for spiral receptor groove 162 is a wedge-shape, or < shape (i.e., an alligator shape as viewed in cross section). In one embodiment, interior edges 140 frictionally engage with, and are supported by, the wedge-shape of spiral receptor groove 162. In another embodiment, spiral receptor groove 162 comprises a "C" shape selected to couple with and secure interior edge 140 of short card 132. Alternately, spiral receptor groove 162 can be configured to be adjustable, for example height adjustable, such that card receptors 164 accepts short cards 132 having varying thickness.

Figure 9:
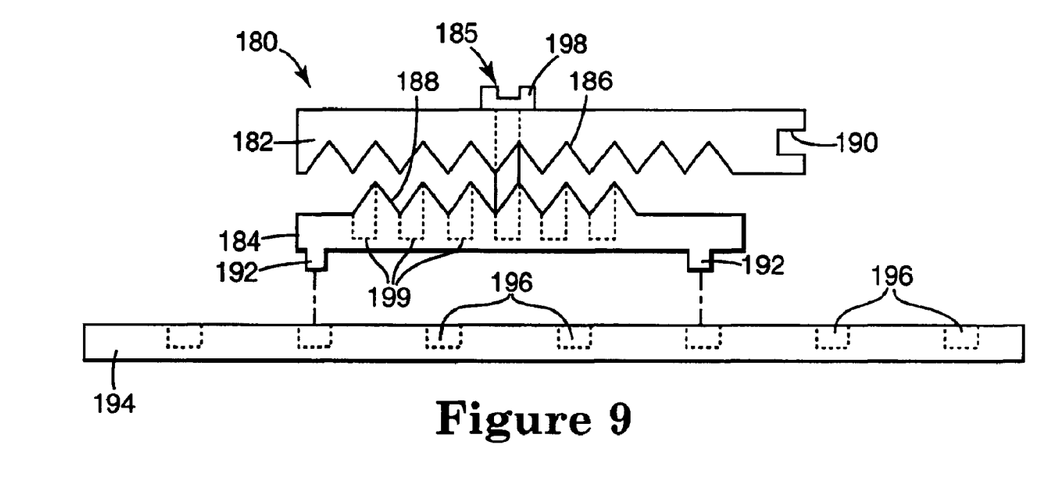
FIG. 9 is a side view of an assembly for supporting a short printed circuit card according to yet another embodiment of the present invention.

In another embodiment illustrated in FIG. 9, a card support block 180 is incrementally adjustable. Card support block 180 includes a first section 182 and a second section 184. First section 182 is removably attached to second section 184 by mechanism 185. First section 182 has a first saw tooth region 186 and second section 184 has a second saw tooth region 188. In one embodiment, first section 182 defines a card receptor 190 and second section 184 defines a coupling device 192. Card support block 180 is removably attached to a card slot separator 194 by mating coupling device 192 into coupling detents 196 formed in card slot separator 194. Accordingly, card support block 180 can be selectively positioned along card slot separator 194 for reception of short cards (not shown). The selective positioning of card support block 180 across card slot separator 194 is coarsely adjusted by a spacing that corresponds to the distance between coupling detents 196. Additionally, first section 182 can be incrementally and selectively positioned with respect to second section 184 such that card receptor 190 can be selectively positioned for reception of short cards. In particular, first section 182 can be incrementally and fine-positioned relative to second section 184 by loosening mechanism 185 and selectively meshing first saw tooth region 186 with second saw tooth region 188. Thereafter, first section 182 can be removably attached to second section 184 by activating mechanism 185. Accordingly, first section 182 is configured to be removably secured and fine-adjusted to second section 184 via mechanism 185 and saw tooth regions 186 and 188. In this regard, in one embodiment mechanism 185 includes a bolt 198 that is removably attached to set holes 199 formed in second section 184. In one embodiment, set holes 199 are spaced a distance apart (corresponding, for example, to a peak-to-peak distance between the saw tooth regions 186 and 188) such that the fine adjustment between the first and second sections 182 and 184, respectively, incrementally ranges across the coarse adjustment provided by the distance between the coupling detents 196. That is to say, the incremental fine-adjustment will be the distance between peaks (or valleys) on either first saw tooth region 186 or second saw tooth region 188. In one embodiment, card receptor 190 defines a "<" shape, or alligator opening, to accommodate short cards of varying thickness. In one embodiment, card support block 180 is configured to couple across substantially the full width of short cards.

Consistent with this disclosure, each of the card support blocks described above is compatible with the practice of hot-swapping cards into and out of a computer system. Hot swapping refers to removing and/or inserting a printed circuit card, including short cards, from the computer system or other electronic system while the computer system or other electronic system is electrically powered. In one embodiment, referring to FIG. 5, short cards 102 are hot swapped with computer system 100 via manipulation of card support block 110. For example, card support block 110 can be moved away from short card 102 by loosening coupling device 116. Thereafter, card receptor 112 can be moved away from short card 102, allowing unfettered access to short card 102. Short card 102 can then be uncoupled from bulkhead guide 106 and electrically and mechanically uncoupled from connector plane 108. In completion of the hot swap routine, a replacement expansion card, for example another short card 102, is mechanically and electrically coupled to computer system 100, and card support block 110 is utilized as described above to support interior edge 120.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An assembly for supporting a short printed circuit card having a first edge in a computer system, the assembly comprising:
   a card slot separator disposed in a plane parallel to the short printed circuit card; and
   at least one card support block having a card receptor adapted to couple with the first edge of the short printed circuit card, wherein the at least one card support block is adapted to couple and be movably attached to the card slot separator, and wherein the at least one card support block is adapted to be selectively positioned for reception of the first edge of the short printed circuit card in a plurality of positions along the card slot separator.

2. The card support block of claim 1, wherein the short printed circuit card has a width along the first edge, and further wherein the card support block is couplable to the short printed circuit card for substantially the full width along the first edge of the short printed circuit card.

3. The assembly of claim 1, wherein the card slot separator has channels adapted to couple with the at least one card support block such that the at least one card support block is adapted to be selectively positioned for reception of the first edge of the short printed circuit card in a plurality of positions along the card slot separator.

4. The assembly of claim 1, wherein the card slot separator has one channel adapted to couple with the at least one card support block such that the at least one card support block is adapted to be selectively positioned for reception of the first edge of the short printed circuit card in a plurality of positions along the card slot separator.

5. The assembly of claim 1, wherein the card receptor is height adjustable to couple with first edges of short printed circuit cards of varying thickness.

6. The assembly of claim 1, wherein the at least one card support block is coupled to the card slot separator via a coupling device selected from the group consisting of clamps, latches, lever, bolts, spring actuated assemblies, and pins.

7. The assembly of claim 1, wherein the at least one card support block enables hot swapping of the short printed circuit card.

8. The assembly of claim 1, wherein the card support block defines a spiral receptor groove configured to provide a variable vertical card receptor position adapted to couple with the first edge of the short printed circuit card.

9. The assembly of claim 1, wherein the at least one card support block is couplable to the card slot separator in at least one position along the card slot separator.

10. The assembly of claim 1, wherein the at least one card support block is couplable to the card slot separator in at least four positions along the card slot separator.

11. The assembly of claim 1, wherein the at least one card support block includes an incrementally positionable card receptor adapted to couple with the first edge of the short printed circuit card.

12. The assembly of claim 1, wherein the at least one card support block is electrically non-conductive.

13. An assembly coupled to a card slot separator in a computer system for supporting a short printed circuit card having a first edge, the assembly comprising:
   at least one card support block movably attached to the card slot separator and having a card receptor adapted to couple with the first edge of the short printed circuit card; and
   a coupling device adapted to secure the at least one card support block to the card slot separator.

14. The assembly of claim 13, wherein the coupling device is selected from the group consisting of clamps, latches, lever, bolts, spring actuated assemblies, and pins.

15. The assembly of claim 13, wherein the short printed circuit card has a width along the first edge, and further wherein the card support block is couplable to the short printed circuit card for substantially the full width along the first edge of the short printed circuit card.

16. The assembly of claim 13, wherein the coupling device is configured to couple to the card slot separator via channels formed in the card slot separator such that the at least one card support block is adapted to be selectively positioned for reception of the first edge of the short printed circuit card in a plurality of positions along the card slot separator.

17. The assembly of claim 13, wherein the coupling device is configured to couple to the card slot separator via one channel formed in the card slot separator such that the at least one card support block is adapted to be selectively positioned for reception of the first edge of the short printed circuit card in a plurality of positions along the card slot separator.

18. The assembly of claim 13, wherein the card receptor is height adjustable to couple with first edges of short printed circuit cards of varying thickness.

19. The assembly of claim 13, wherein the at least one card support block is couplable to the card slot separator in at least one position.

20. The assembly of claim 13, wherein the at least one card support block enables hot swapping of the short printed circuit card.

21. The assembly of claim 13, wherein the card support block defines a spiral receptor groove configured to provide a variable vertical card receptor position adapted to couple with the first edge of the short printed circuit card.

22. The assembly of claim 13, wherein the at least one card support block is couplable to the card slot separator in at least four positions along the card slot separator.

23. The assembly of claim 13, wherein the at least one card support block includes an incrementally positionable card receptor adapted to couple with the first edge of the short printed circuit card.

24. A method of supporting a short printed circuit card in a computer system, the method comprising:
- inserting the short printed circuit card into the computer system;
- movably attaching at least one card support block to a card slot separator;
- traversing the at least one card support block along the card slot separator until the at least one card support block is adjacent to the short printed circuit card;
- coupling the at least one card support block to a first edge of the short printed circuit card; and
- securing the at least one card support block to the card slot separator.

25. A method of supporting a short printed circuit card having an interior edge coupled to at least one card support block, wherein the short printed circuit card is insertable into a computer system having a bulkhead guide, a connector plane, and a card slot separator, the method comprising:
- inserting the short printed circuit card into the computer system;
- mechanically coupling the short printed circuit card to the bulkhead guide;
- mechanically and electrically coupling the short printed circuit card to the connector plane; and
- coupling the at least one card support block to the card slot separator.

26. An assembly for supporting a short printed circuit card having a first edge in a computer system, the assembly comprising:
- a card slot separator disposed in a plane parallel to the short printed circuit card;
- at least one card support block having a card receptor adapted to couple with the first edge of the short printed circuit card, wherein the at least one card support block is adapted to couple and be movably attached to the card slot separator; and
- means for selectively positioning the at least one card support block for reception of the first edge of the short printed circuit card in a plurality of positions along the card slot separator.

* * * * *